US006842046B2

(12) United States Patent
Tzartzanis et al.

(10) Patent No.: US 6,842,046 B2
(45) Date of Patent: Jan. 11, 2005

(54) LOW-TO-HIGH VOLTAGE CONVERSION METHOD AND SYSTEM

(75) Inventors: Nestor Tzartzanis, Belmont, CA (US); William W. Walker, Los Gatos, CA (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/066,355

(22) Filed: Jan. 31, 2002

(65) Prior Publication Data

US 2003/0141899 A1 Jul. 31, 2003

(51) Int. Cl.[7] .............................................. H03K 19/096
(52) U.S. Cl. .............................. 326/98; 326/95; 326/81; 326/63; 326/68
(58) Field of Search ............................... 326/93–98, 62, 326/68, 81, 83, 119, 121

(56) References Cited

U.S. PATENT DOCUMENTS

| | | |
|---|---|---|
| 5,453,708 A | 9/1995 | Gupta et al. |
| 5,517,136 A | 5/1996 | Harris et al. |
| 5,594,371 A * | 1/1997 | Douseki ..................... 326/119 |
| 5,815,005 A | 9/1998 | Bosshart |
| 5,815,687 A | 9/1998 | Masleid et al. |
| 5,825,224 A | 10/1998 | Klass et al. |
| 5,831,451 A | 11/1998 | Bosshart |
| 5,859,547 A | 1/1999 | Tran et al. |
| 5,867,036 A | 2/1999 | Rajsuman |
| 5,870,411 A | 2/1999 | Durham et al. |
| 5,880,608 A | 3/1999 | Mehta et al. |
| 5,910,735 A | 6/1999 | Allen |
| 5,920,218 A | 7/1999 | Klass et al. |
| 6,002,271 A | 12/1999 | Chu et al. |
| 6,002,292 A | 12/1999 | Allen et al. |
| 6,011,410 A | 1/2000 | Kim et al. |
| 6,025,741 A | 2/2000 | Ciraula et al. |
| 6,043,696 A | 3/2000 | Klass et al. |
| 6,049,231 A | 4/2000 | Bosshart |
| 6,097,207 A | 8/2000 | Bernstein et al. |
| 6,104,212 A | 8/2000 | Curran |
| 6,108,805 A | 8/2000 | Rajsuman |
| 6,118,304 A | 9/2000 | Potter et al. |
| 6,121,796 A | 9/2000 | Ciraula et al. |
| 6,121,807 A | 9/2000 | Klass et al. |
| 6,188,247 B1 | 2/2001 | Storino et al. |
| 6,201,425 B1 | 3/2001 | Kartschoke et al. |
| 6,204,696 B1 | 3/2001 | Krishnamurthy et al. |
| 6,225,826 B1 | 5/2001 | Krishnamurthy et al. |
| 6,233,707 B1 | 5/2001 | Potter et al. |
| 6,239,620 B1 | 5/2001 | Aoki et al. |

(List continued on next page.)

OTHER PUBLICATIONS

Usami et al., "Clustered Voltage Scaling Technique for Low–Power Design", ISLPD 1995 Symposium Proceedings, Apr. 1995.

(List continued on next page.)

*Primary Examiner*—Vibol Tan
(74) *Attorney, Agent, or Firm*—Sheppard Mullin Richter & Hampton LLP (57) ABSTRACT

A system and method, for converting a voltage input from a low voltage source to a voltage output at a high voltage source using a domino logic circuit design. An embodiment provides a low to high voltage conversion system. The system includes: a pull-up transistor coupled to a high voltage source for charging a node, when a precharge signal is received; a low voltage source used for setting an input voltage; a pull-down network for discharging the node depending, at least in part, on the input voltage; and an output voltage determined from the node.

28 Claims, 8 Drawing Sheets

U.S. PATENT DOCUMENTS

| | | |
|---|---|---|
| 6,246,266 B1 | 6/2001 | Bosshart |
| 6,252,417 B1 | 6/2001 | Adams et al. |
| 6,275,071 B1 | 8/2001 | Ye et al. |
| 6,281,710 B1 | 8/2001 | Poirier et al. |
| 6,369,606 B1 * | 4/2002 | Houghton et al. ............ 326/36 |

OTHER PUBLICATIONS

Zhang et al., "Low–Swing Interconnect Interface Circuits", ISLPED98, Aug. 1998.

Zhang et al., "Low–Swing On–Chip Signaling Techniques: Effectiveness and Robustness", IEEE Transactions on VLSI Systems, vol. 8, No. 3, Aug. 2000.

N. Tzartzanis, et al., *Clock–Powered Logic for a 50 MHz Low–Power RISC Datapath*, 1997 ISSCC Digest of Technical Papers, Feb. 6–8, 1997 (IEEE), Session 20.5.

W. Athas, et al., A *Low–Power Microprocessor Based on Resonant Energy*, IEEE JSSC, vol. 32, No. 11, Nov. 1997.

W. Athas, et al., *Clock–Powered CMOS VLSI Graphics Processor for Embedded Display Controller Application*, 2000 ISSCC Digest of Technical Papers, Feb. 7–9, 2000, Session WA 17.5 (IEEE).

N. Tzartzanis, et al., *A Low–Power SRAM with Resonantly Powered Data, Address, Word, and Bit Lines*, European Solid–State Circuits Conference, Stockholm, Sweden, Sep. 19–21, 2000.

W. Athas, et al., *The Design and Implementation of a Low–Power Clock–Powered Microprocessor*, IEEE Journal Of Solid–State Circuits, vol. 35, No. 11, pp. 1561–1570 Nov. 2000.

* cited by examiner

LOW-TO-HIGH VOLTAGE CONVERSION METHOD AND SYSTEM

FIELD OF THE INVENTION

The invention relates generally to the field of circuit design, and in particular to a method and system for Low-to-High voltage conversion in an electronic circuit.

BACKGROUND OF THE INVENTION

While low power consumption in a digital circuit design is a desirable design goal, its importance has increased in today's market where many consumer devices, e.g., cell phones, digital cameras, laptops, Personal Digital Assistants (PDAs), and games, depend upon batteries to supply power. One conventional technique is to use different supply voltage sources in a circuit. For example, the part of the circuit that needs high performance uses one supply voltage, while the rest of the circuit uses a lower supply voltage to reduce power consumption.

However, high voltage circuits draw static current when driven by low voltage signals. For example, a pMOS transistor connected to a high voltage supply is typically turned off when the gate of the transistor has a voltage approximately greater than the high voltage supply minus a threshold voltage. Typically, a voltage representing a logical '1' or a high logic level from a low voltage power supply applied at the gate of the pMOS transistor does not meet the above transistor cut-off criteria, and static current flows in the pMOS transistor.

Figure 1:
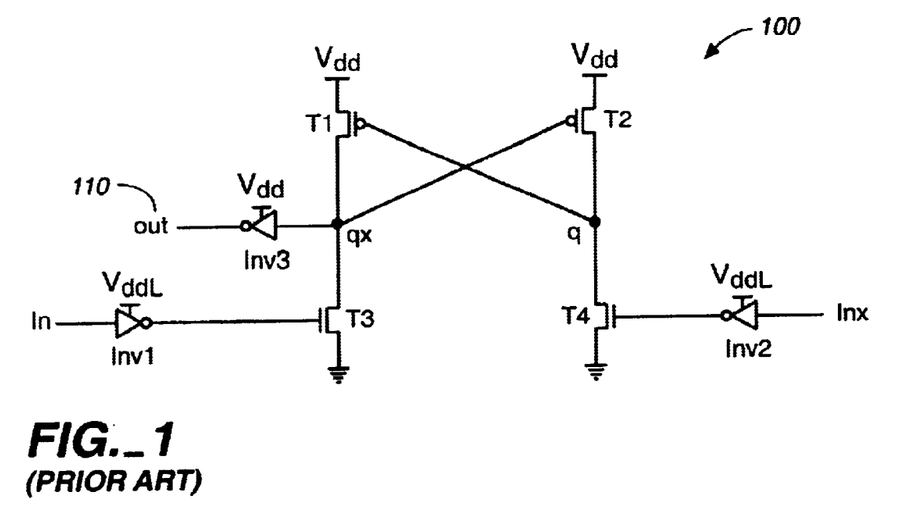
FIG. 1 is a schematic diagram of a simple prior art low-to-high voltage converter.

In order to eliminate the static current when there are multiple voltage supply sources, one prior art technique uses a voltage level converter to convert the output of a low voltage Boolean logic circuit to a high voltage result before inputting it into a high voltage Boolean logic circuit. FIG. 1 is a schematic of a simple prior art low-to-high voltage converter. Vdd is the high voltage supply and VddL is the low voltage supply. The Boolean input is "In" and its inverse is "Inx." Both In and Inx have low and high logic levels set by VddL. Input In is connected via inverter Inv1 to the gate of nMOS transistor T3. Input Inx is connected via inverter Inv2 to the gate of nMOS transistor T4. The drain "qx" of transistor T3 is connected to the drain of pMOS transistor T1 and the gate of pMOS transistor T2. Similarly, the drain "q" of transistor T4 is connected to the drain of pMOS transistor T2 and the gate of pMOS transistor T1. qx is connected to the output "out" 110 of the voltage converter via inverter Inv3. When In='1' and Inx='0', then T3 is off and T4 is on. Hence q='0' and qx='1,' where the voltage of the high or '1' logic level of qx is set by Vdd. Thus the input to inverter Inv3 is at the high voltage, high logic level, and the output out 110 of the voltage level converter 100 is a '0'. When In is switched from '1' to '0' (Inx goes from '0' to '1'), T3 turns on, discharging qx toward ground, T4 turns off and T2 turns on, charging q toward Vdd, which cuts off T1. Subsequently output out 110 goes to '1' set by the Vdd or high voltage supply. During the transition time of the converter 100, there is short circuit current through T1 and T3. There is similar short circuit current through T2 and T4, when q='1' and qx='0', and Inx goes from '1' to '0'. Pull-down nMOS transistors T3 and T4 must be stronger than pull-up pMOS transistors T1 and T2 to allow the converter 100 to switch, when In and Inx switch. Although the above simple voltage converter 100 eliminates or nearly eliminates static current in the Boolean logic circuits at quiescent time, i.e., when the inputs are stable, problems occur when the converter 100 switches. There is short circuit current during the transitions, and there is a delay because the switching is only completed when both q and qx have switched.

Figure 2:
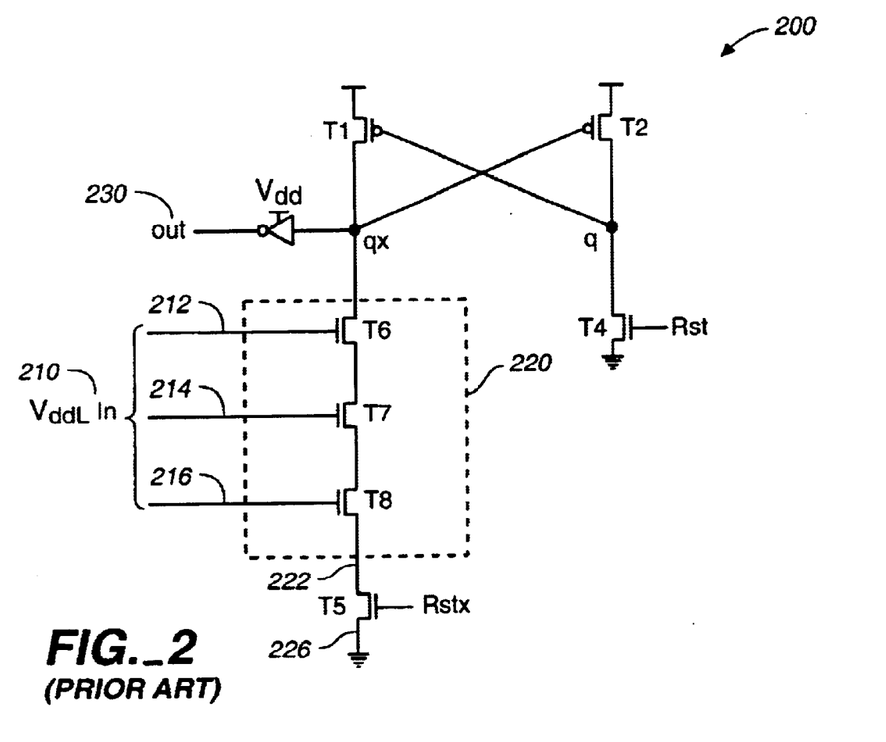
FIG. 2 is a schematic diagram of a prior art dynamic voltage converter with an implementation of a Boolean function.

The voltage converter of FIG. 1 can be combined with some of the low voltage Boolean logic circuit to give the cross-coupled CMOS topology of the prior art circuit of FIG. 2. The logic network 220 shown in FIG. 2 is part of a three-input "AND" gate and has low voltage inputs "VddL In" 210, e.g., input 212, 214, and 216. Input 212 is connected to the gate of nMOS transistor T6, input 214 is connected to the gate of nMOS transistor T7, and input 216 is connected to the gate of nMOS transistor T8. Transistors T6, T7, and T8 are connected in series and are part of logic network 220. The gate of nNMOS transistor T4 is connected to a low voltage reset signal "Rst," whose inverse signal is "Rstx." During evaluation, Rstx is '1' and nMOS transistor T5 connects node 222 of logic network 220 to ground 226. During reset, Rstx is '0", which disables the logic network 220 by turning T5 off, and Rst is "1" which causes q to reset to '0' and qx to reset to '1'. This voltage converter circuit 200 has the same disadvantage as the voltage converter 100 of FIG. 1 in that there is short circuit current during reset, e.g., qx switches from '1' to '0,' and during evaluation (Rstx='1'), e.g., q switches from '1' to '0.' There is also a time delay as in the circuit of FIG. 1, because switching is not completed until both q and qx switch.

Therefore there is a need for a low-to-high voltage conversion which reduces short-circuit current during switching and has reduced delay time.

SUMMARY OF THE INVENTION

The present invention provides a system and method for converting a voltage input from a low voltage source to a voltage output at a high voltage source using a domino logic circuit design. In one aspect of the invention the domino logic gates, using a low voltage source, are connected to domino logic gates using a high voltage source without need for a separate, i.e., explicit, low-to-high voltage converter circuit. Another aspect is that there is little or no static current loss at quiescent time from the logic gates using the multiple voltage sources. Yet another aspect is that there is less delay and lower power consumption than conventional low-to-high voltage converter circuits.

An embodiment of the present invention includes a method for converting an input signal, comprising an input voltage from a low voltage source, to an output signal, comprising an output voltage from a high voltage source, by a digital circuit, comprising a pull-down logic network coupled to a node. First the node is precharged to a high voltage using the high voltage source. Then the input voltage from the low voltage source is received by the pull-down logic network. Next, a voltage of the node is determined based on evaluating the pull-down logic network. And the output voltage is determined using the voltage of the node.

Another embodiment of the present invention provides a low-to-high voltage conversion system. The system comprises: a pull-up transistor coupled to a high voltage source for charging a node, when a precharge signal is received; a low voltage source used for setting an input voltage, wherein the low voltage source produces a voltage reference less than the high voltage source; a pull-down network for discharging the node depending, at least in part, on the input voltage; and an output voltage determined from the node.

An aspect of the present invention comprises a system for converting a first logic level at a low voltage to a second logic level at a high voltage. The system comprises: a pull-up transistor coupled to a high voltage source for charging a node, when a precharge signal is at a low logic level; an input signal, comprising an input voltage representing the first logic level, the input voltage set by using a low voltage source; a pull-down network for discharging the node depending, at least in part, on the input voltage; a footer switch, comprising an nMOS transistor, and connecting the pull-down network to ground when the precharge signal is at a high logic level; and a keeper circuit, comprising a pMOS transistor, for maintaining the node when charged; and an output voltage determined from the node.

Another aspect of the present invention provides a system for converting an input signal, comprising an input voltage from a low voltage source, to an output signal, comprising an output voltage from a high voltage source. The system comprises: means for precharging a node to a high voltage using the high voltage source; means for evaluating a voltage of the node based on the input voltage from the low voltage source and a pull-down network, wherein the pull-down network has means for connecting the pull-down network to ground; and means for using the voltage of the node to determine the output voltage.

Yet another embodiment of the present invention includes a register file (RF) circuit for storing data. The RF comprises: a write circuit for writing data to a plurality of memory cells, where the write circuit comprises a voltage conversion circuit that comprises a low voltage source and a high voltage source; a read circuit for reading data from the plurality of memory cells; and a timing circuit comprising real and dummy timing paths.

These and other embodiments, features, aspects and advantages of the invention will become better understood with regard to the following description, appended claims and accompanying drawings.

DETAILED DESCRIPTION OF THE INVENTION

In the following description, numerous specific details are set forth to provide a more thorough description of the specific embodiments of the invention. It is apparent, however, to one skilled in the art, that the invention may be practiced without all the specific details given below. In other instances, well known features have not been described in detail so as not to obscure the invention.

In determining an embodiment of the present invention to perform low-to-high voltage conversion with a Boolean logic function, domino logic circuit designs were examined. Domino logic circuit designs offer significant speed advantages over logic circuits employing more traditional designs, such as those that utilize pass gate or static logic designs. In particular, because domino logic circuits employ a "precharge" state, they can be switched more quickly than a comparable static logic circuit.

Figure 3:
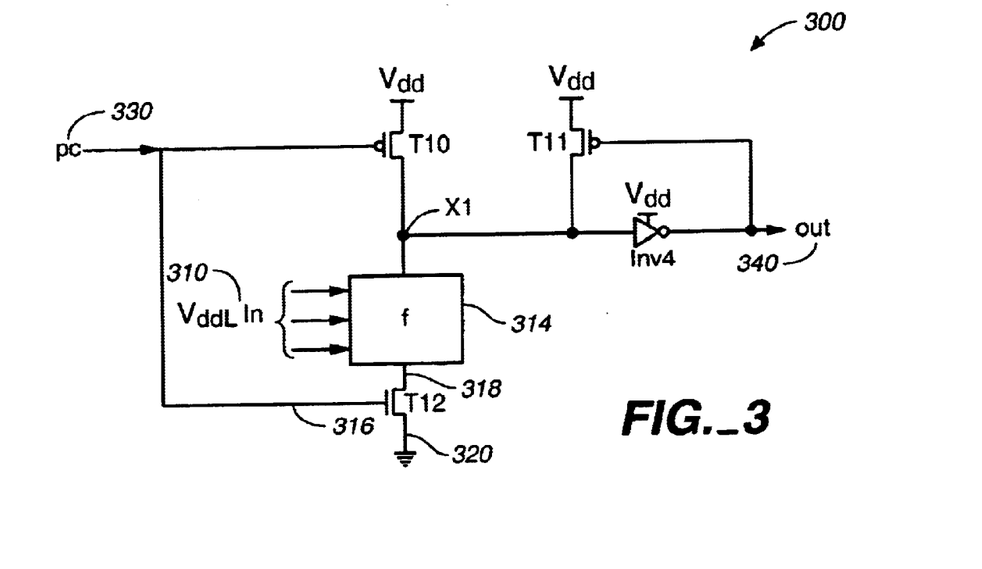
FIG. 3 is a schematic diagram of a low-to-high voltage converter circuit with a logic function of a preferred embodiment of the present invention.

FIG. 3 is a schematic diagram of a low-to-high voltage converter circuit 300 with a logic function of a preferred embodiment of the present invention. The converter circuit 300 uses a domino logic circuit design. The logic inputs into circuit 300 are shown by VddL In 310. One or more of the VddL In 310 inputs is set by the low voltage supply VddL. The remaining inputs may be set by high voltage supply Vdd. Hence, for example, if there is only one input, then it is set by low voltage supply VddL; if there are two inputs, then one is set by low voltage supply VddL and the other is set by either low voltage supply VddL or high voltage supply Vdd; etc. These inputs 310 go into Boolean logic function f implemented by Boolean logic NMOS pull-down network 314. Pull-down network 314 is connected via node 318 to NMOS transistor T12, which is coupled to ground 320. The gate 316 of transistor T12 receives an input precharge signal, i.e., "pc" 330. When pc 330 is '1' or a high logic level, transistor T12 grounds pull-down network 314 by turning on. When pc 330 is '0' or a low logic level, transistor T12 disconnects pull-down network 314 from ground 320. The '1' logic voltage level of pc is set using Vdd.

The converter circuit 300 typically operates in two stages in a cycle, i.e., the precharge stage and the evaluate stage. During the precharge stage pc is '0,' and node X1 becomes charged to '1,' with a voltage level determined by the high voltage supply Vdd. Node X1 is connected to a keeper circuit having an inverter Inv4 and a pMOS transistor T11. For node X1='1,' the output out 340 of circuit 300 is '0.' Out 340 is fed back via transistor T11 to keep node X1 at '1.' During the evaluate stage pc='1,' T10 is off, and T12 is turned on. As pull-down network 314 is now grounded via transistor T12, depending on the low voltage level inputs, i.e., VddL In 310, and the Boolean function, f, of pull-down network 314, node X1 may be discharged, i.e., X1 goes to '0.' If X1='0,' the output out 340 has logic value '1' with a level set by the high voltage supply Vdd. Thus low voltage logic inputs (VddL In 310) are processed through an nMOS pull-down network 314 representing a Boolean logic function f to produce a high voltage logic output (out 340), that may be used in a subsequent high voltage logic circuit.

An nMOS pull-down network 314 is used, because the low voltage '1' inputs (VddL In 310) need to be above the nMOS threshold voltage ($V_{GS}>V_{THn}$) to turn the nMOS transistors on. Unlike the prior art, there is no pMOS pull-up transistor conducting during the evaluate stage, thus the minimum low voltage level in circuit 300 is independent of the ratio of any of the transistors in the circuit, provided the keeper transistor T11 is small. Ordinarily, T11 is sized large enough to overcome leakage current in the pull-down network 314 when it is not conducting, but no larger.

Figure 4:
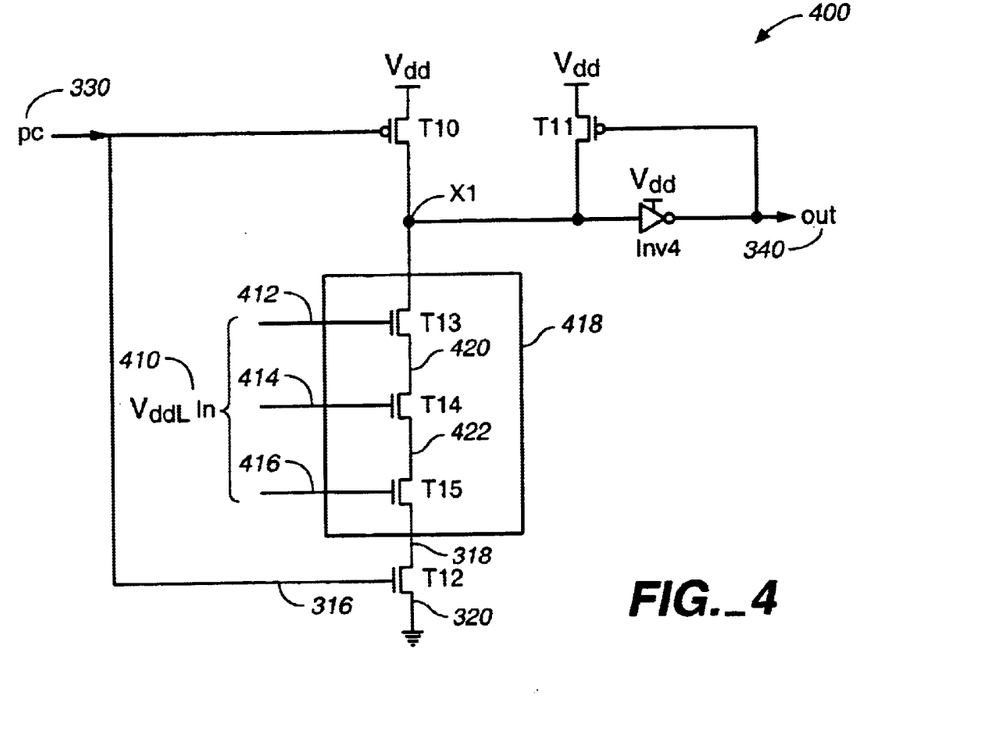
FIG. 4 illustrates an example of FIG. 3 with an AND logic function.

FIG. 4 illustrates an example of FIG. 3 with an AND logic function. The low-to-high voltage conversion 400 circuit includes a pMOS transistor T10 that acts as a precharge device, a pMOS transistor T11 that acts as a keeper device, an inverter buffer Inv4, an output out 340, a precharge input signal pc 330, an nMOS transistor T12 that is referred to as a foot switch, a pair of nMOS transistors T10 and T12, input signals VddL In 410, e.g., AND input signals 412, 414, and 416, and precharge node X1. One or more of input signals VddL In 410 is set by low voltage supply VddL. The circuit 400 operates in two stages, the precharge stage and the evaluate stage. During the precharge stage, pc is low causing precharge transistor T10 to charge node X1 to Vdd. Accordingly, inverter buffer Inv4 causes the output out 340 to go low and keeper transistor T11 to turn on causing node X1 to be maintained or "kept" at Vdd. During the evaluate stage, pc goes high and the foot switch T12 turns on, allowing the evaluation of AND inputs 412, 414, and 416. Thus, if inputs 412, 414, and 416 are high, node X1 is discharged to ground, and output 340 goes high. Alternatively, if one or more of 412, 414, and/or 416 are low, node X1 remains high due to the capacitance existing at node X1. Keeper device T11 prevents node X1 from dropping during the evaluate stage due to various leakage mechanisms. The pMOS keeper transistor T11 is generally a weak transistor, presenting very little delay during times when inputs 412, 414, and 416 go high to pull-down node X1. While node X1 is being discharged, there is a short circuit current through transistors T11, T13, T14, T15, and T12; however, this current is less than in the prior art circuit shown in FIG. 2, because pMOS transistor T11 is weak, i.e., draws a small amount of current. Note that pMOS transistor T10 is turned off during evaluation (pc='1'), so that short circuit current does not flow through T10 to ground 320. In addition, there is only one node X1 that needs to be discharged, unlike FIG. 2 which requires both qx to be discharged and q charged, before switching is completed. This single node X1 and weak pMOS T11 improves the switching time for circuit 400 (FIG. 4) over the prior art circuit 200 (FIG. 2).

Once the evaluation is complete and pc 330 is again low, it is desirable to quickly recharge node X1 to Vdd. Therefore, precharge transistor T10 must be of sufficient size to meet this requirement. Accordingly, for high-performance logic paths, precharge transistor T10 is necessarily much larger than keeper transistor T11. For example, if precharge transistor T10 has a width-to-length ratio of 1/1, keeper transistor T11 may have a width-to-length ratio of 1/10.

Figure 5:
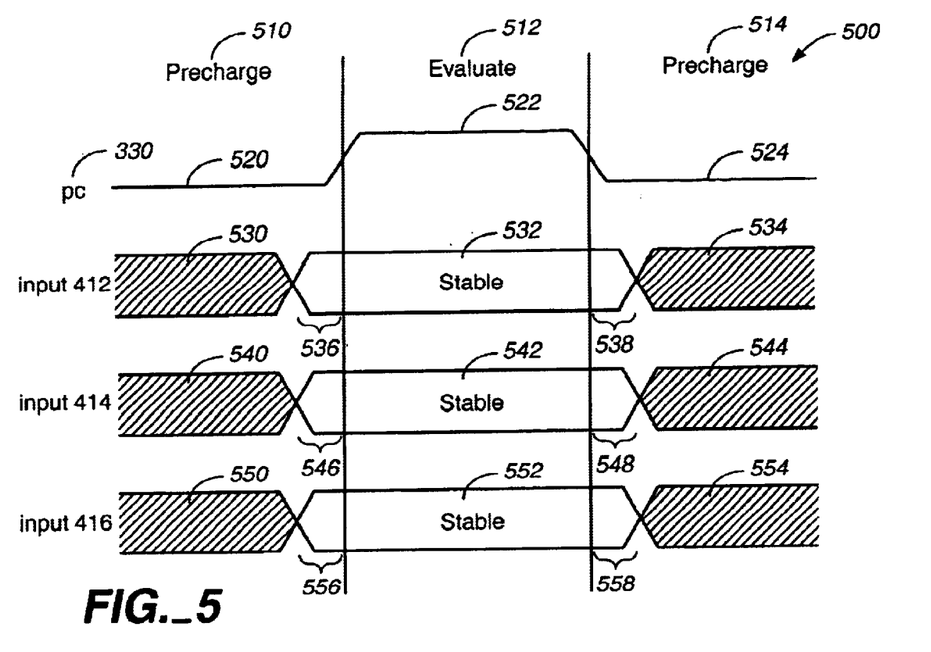
FIG. 5 is a simplified timing diagram for the inputs, pc and VddL In of FIG. 4 of an embodiment of the present invention.

FIG. 5 is a simplified timing diagram for the inputs, pc 330 and VddL In 410 (inputs 412, 414, and 416), of FIG. 4 of an embodiment of the present invention. The timing diagram shows three stages: a precharge stage 510 followed by an evaluate stage 512 followed by another precharge stage 514. Precharge signal pc 330 is '0' 520 during the precharge stage 510, then '1' 522 during the evaluate stage 512, and then '0' 524 during the next precharge stage 514. Inputs 412, 414, and 416 are indeterminate during a portion of the precharge stage 510 (regions 530, 540, and 550). The inputs then go through a setup period (regions 536, 546, and 556) in the precharge stage 510, where the inputs are stable, i.e., either '1' or '0'. The inputs 412, 414, and 416 remain stable during the evaluate stage 512 (regions 532, 542, and 552) and afterwards for a hold period (areas 538, 548, and 558) in the second precharge stage 514. The inputs may then be indeterminate for the rest of the precharge stage 514 (regions 534, 544, and 554).

Figure 6:
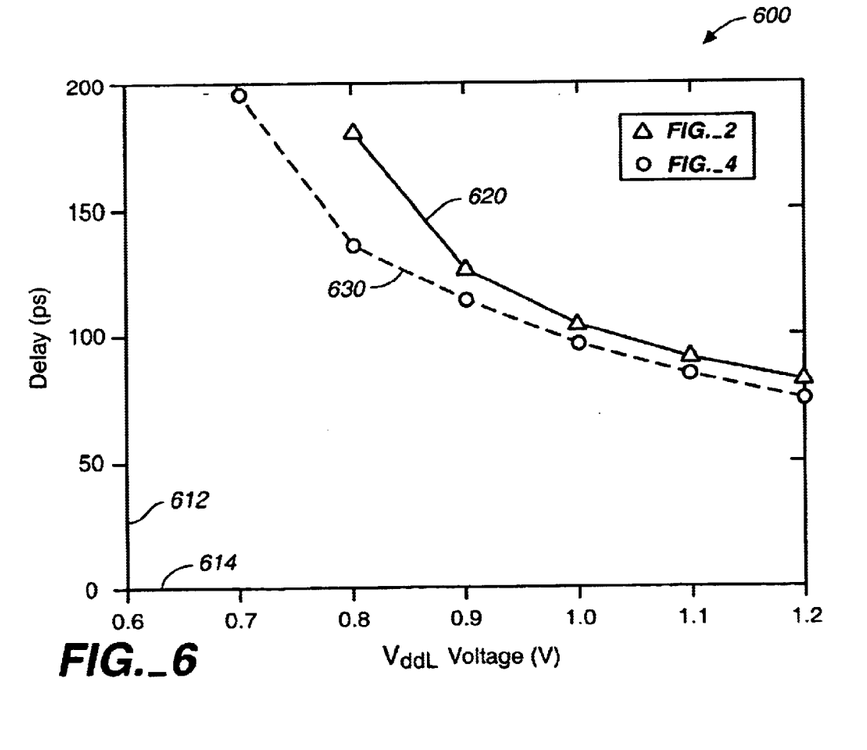
FIG. 6 is a graph of delay vs. VddL voltage from a simulation comparing the prior art circuit in FIG. 2 with the circuit in FIG. 4.

FIG. 6 is a graph 610 of delay vs. VddL voltage (v) from an HSPICE simulation, comparing the prior art circuit 200 in FIG. 2 with the circuit 400 in FIG. 4. The high-voltage supply Vdd is set at 1.2 volts. Rst, Rstx, and pc inputs is set at Vdd. The x-axis 614 of graph 610 shows the low voltage supply VddL from 0.6 to 1.2 volts (v). The y-axis 612 shows the 50% time delay from the inputs to the output in pico seconds (ps). The curve 620 shows the simulation results for the circuit 200 of FIG. 2 for the low supply voltages from 0.8 to 1.2 v. The circuit 200 could not operate when the low supply voltage was 0.7. The curve 630 shows the results for the circuit 400 of FIG. 4 for VddL from 0.7 to 1.2 v. The delay improvement of circuit 400 (FIG. 4) over circuit 200 (FIG. 2) varied from 25% down to 7% as VddL increased. The energy consumed was reduced by 40% for circuit 400 over circuit 200 over one full cycle.

It can be seen that the circuit 400 of FIG. 4 has less delay and consumes less power than the prior art circuit 200 of FIG. 2. In addition circuit 400 can operate at a lower bound of VddL than circuit 200, e.g., below 0.8 v. Circuit 400 operates at inputs at a lower supply voltage than circuit 200, because the relatively large pMOS transistor T10 is turned off during evaluation and the short circuit current from the small pMOS transistor T11 is relatively small. In the case of circuit 200 of FIG. 2 the pMOS transistor T1 is on until q switches from '0' to '1' and a relatively large short circuit current flows through logic circuit 220. Thus VddL In 210 in FIG. 2 must have a larger minimum low voltage level for its logic '1' inputs, than VddL In 410 in FIG. 4.

Figure 7:
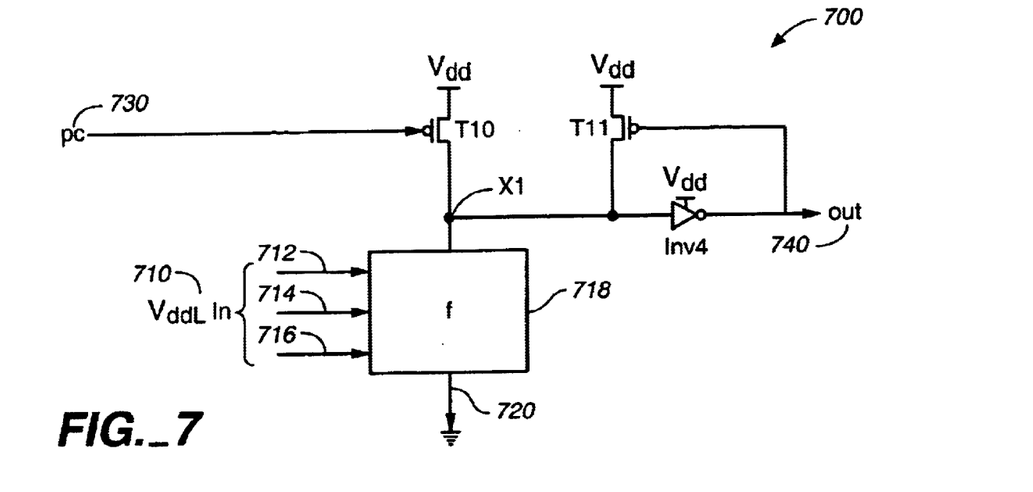
FIG. 7 is a schematic diagram of a low-to-high voltage converter with a Boolean function according to a second embodiment of the present invention.

FIG. 7 is a schematic of a low-to-high voltage converter with a Boolean function according to a second embodiment of the present intention. FIG. 7 is similar to FIG. 3 except that nMOS transistor T12 has been removed and nMOS pull-down circuit 718 is connected directly to ground 720. One example of a use of circuit 700 is in a second-stage domino circuit following circuit 300 of FIG. 3. For proper operation, circuit 700 must have the voltage inputs, i.e., VddL In 710, e.g., inputs 712, 714, and 716, set to '0' during the precharge stage, where one or more of input signals VddL In 710 is set by low voltage supply VddL. FIG. 7 is called a footless domino circuit, because the foot switch transistor T12 is missing.

Figure 8:
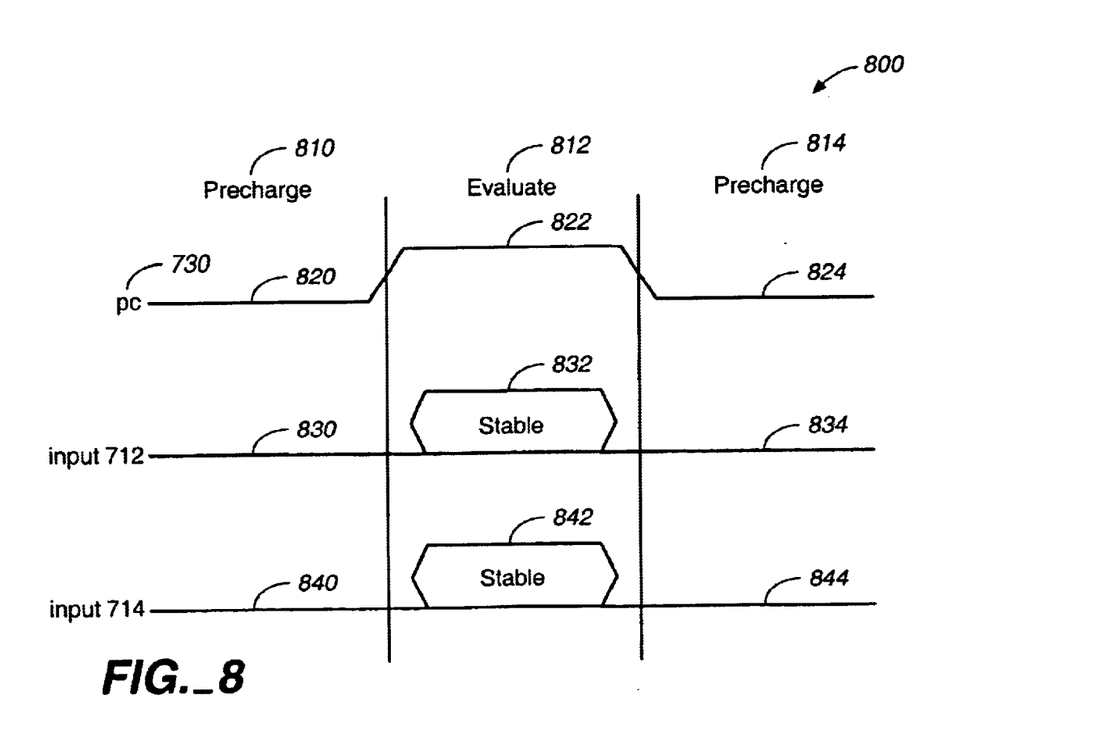
FIG. 8 is a simplified timing diagram of the inputs pc and VddL In of FIG. 7.

FIG. 8 is a simplified timing diagram of the input pc 730, and inputs 712, 714, and 716 of FIG. 7. The simplified timing diagram shows three stages: a precharge stage 810 followed by an evaluate stage 112, and followed by another precharge stage 814. During the first precharge stage 810, pc 730 and inputs 712, 714 and 716 are '0'. During the evaluate stage 812, pc 730 is set to '1' (822) and inputs 712, 714 and 716 must remain stable (areas 832 and 842) at '0' or switch monotonically to '1'. In the next precharge stage 814, pc 730, inputs 712, 714, and 716 must again be '0.' From FIG. 7, during the precharge stage 810, transistor T10 is turned on charging node X1 to near the voltage level of Vdd, and because all inputs, i.e. VddL In 710, are '0,' pull-down network 718 is disconnected from ground 720. During the evaluate stage 812, pc 730 is '1', turning off transistor T10, and node X1 may be discharged depending on the inputs VddL In 710 and pull-down network 718.

Figure 9:
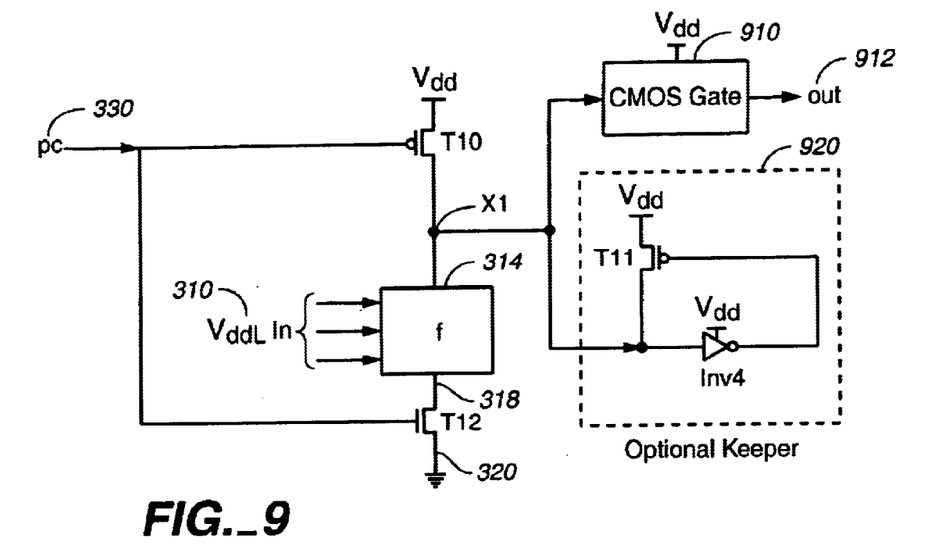
FIG. 9 is a schematic diagram of a low-to-high voltage converter with a Boolean function according to a third embodiment of the present invention.

FIG. 9 is a schematic diagram of a low-to-high voltage converter of a third embodiment of the present invention for implementing a Boolean function comprising one or more logic gates. FIG. 9 is similar to FIG. 3 except the keeper circuit 920 (i.e., transistor T11 connected to inverter Inv4) is optional, and node X1 is connected to a CMOS gate 910, then to output out 912, rather than to Inv4, then to out 340. The CMOS gate 910 may be a NAND gate, a NOR gate, an inverter, or other logic gate. As node X1 is set by Vdd, the CMOS gate can be part of a subsequent high voltage logic circuit.

Some of the advantages of the low-to-high voltage converter circuits of FIGS. 3, 4, 7, and 9 over the prior art include: 1) a reduction in short circuit current during switching; 2) a shorter delay; and 3) low and high voltage precharge gates can be interchanged in a domino style without the need of any special low-to-high voltage converter circuit.

To illustrate the above third advantage of the interchanging of low and high voltage gates using, for example, the circuit 300 of FIG. 3, a new register file (RF) circuit design is provided (FIG. 12) as an embodiment of the present invention. In FIG. 3 if the high voltage supply Vdd is replaced by the low voltage supply VddL and all inputs VddL In 310 are at the low voltage supply level, then circuit 300 is a low voltage domino circuit design of the Boolean function f. For example, circuit 400 of FIG. 4 with Vdd replaced by VddL is a low voltage three input AND gate, where out 340 has logic value '1' or '0' at the low voltage supply level. Similarly, if in FIG. 3 with Vdd as the high voltage supply, VddL In 310 has all high voltage supply inputs, then circuit 300 is a high voltage domino circuit design of the Boolean function f. Circuit 300 is a low-to-high voltage converter with a Boolean logic function f (pull-down network 314), when one or more inputs VddL In 310 are at the low voltage supply level. The combination of the above three aspects of FIG. 3, e.g., low voltage logic circuit, high voltage logic circuit, and low-to-high voltage converter circuit with a logic function, is illustrated in FIG. 12.

Figure 10:
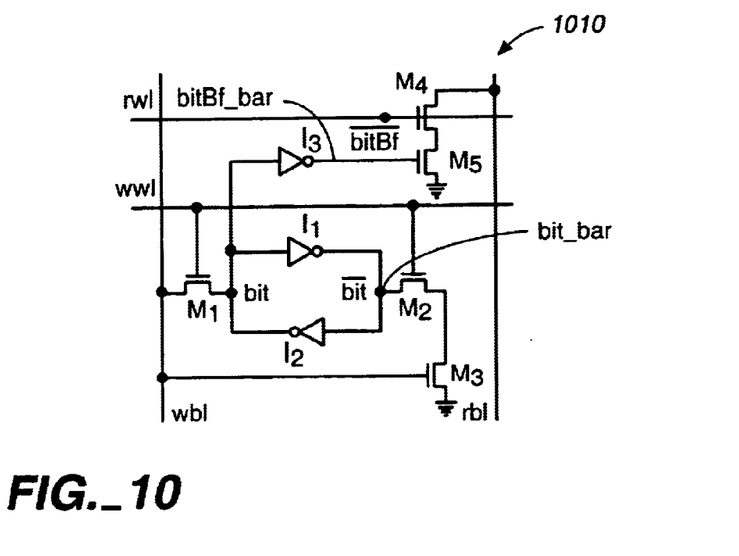
FIG. 10 is a schematic diagram of a representative memory cell having one write and one read port.
Figure 11:
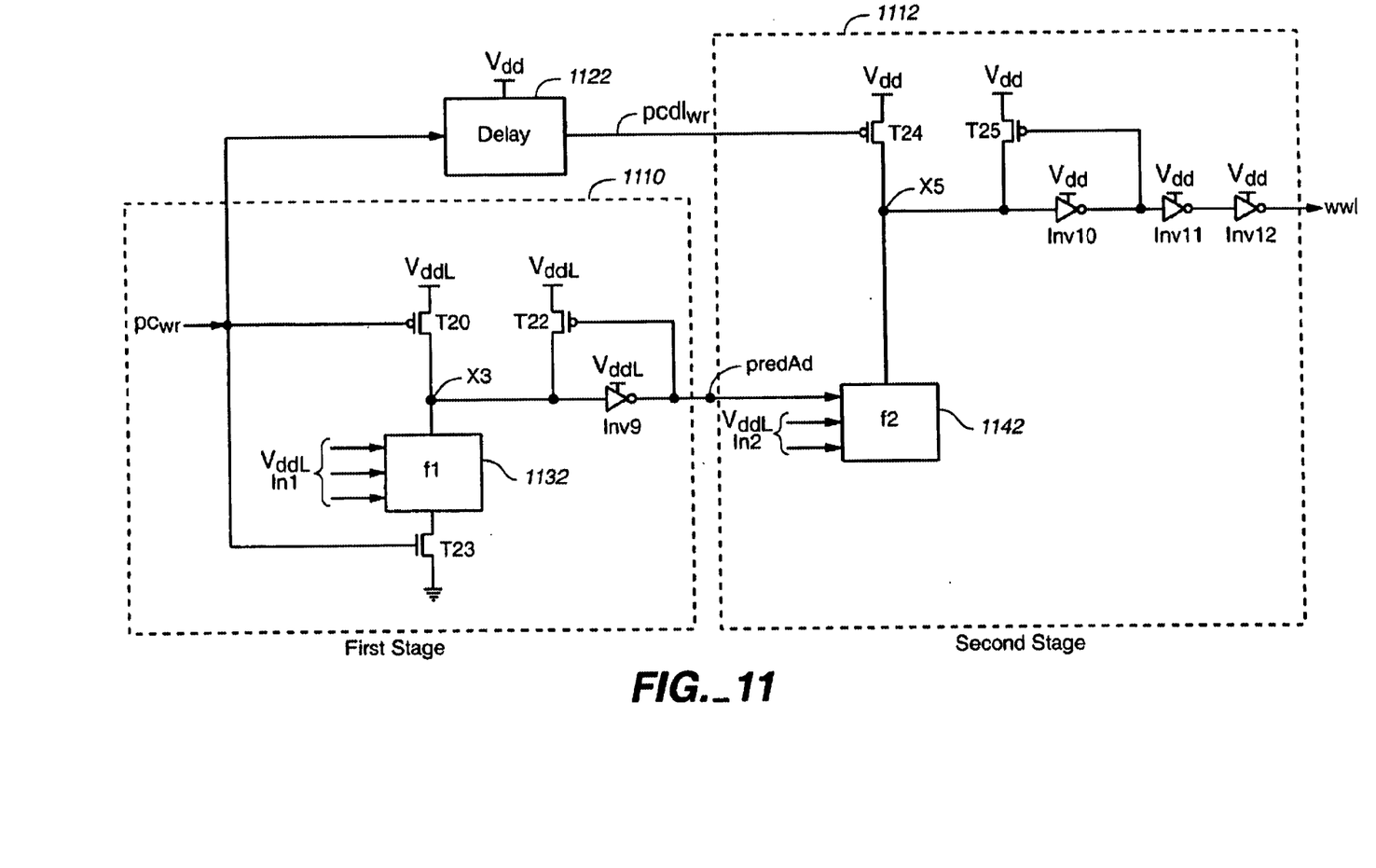
FIG. 11 is a schematic diagram of a two-stage dynamic domino logic circuit of an aspect of the present invention.
Figure 12:
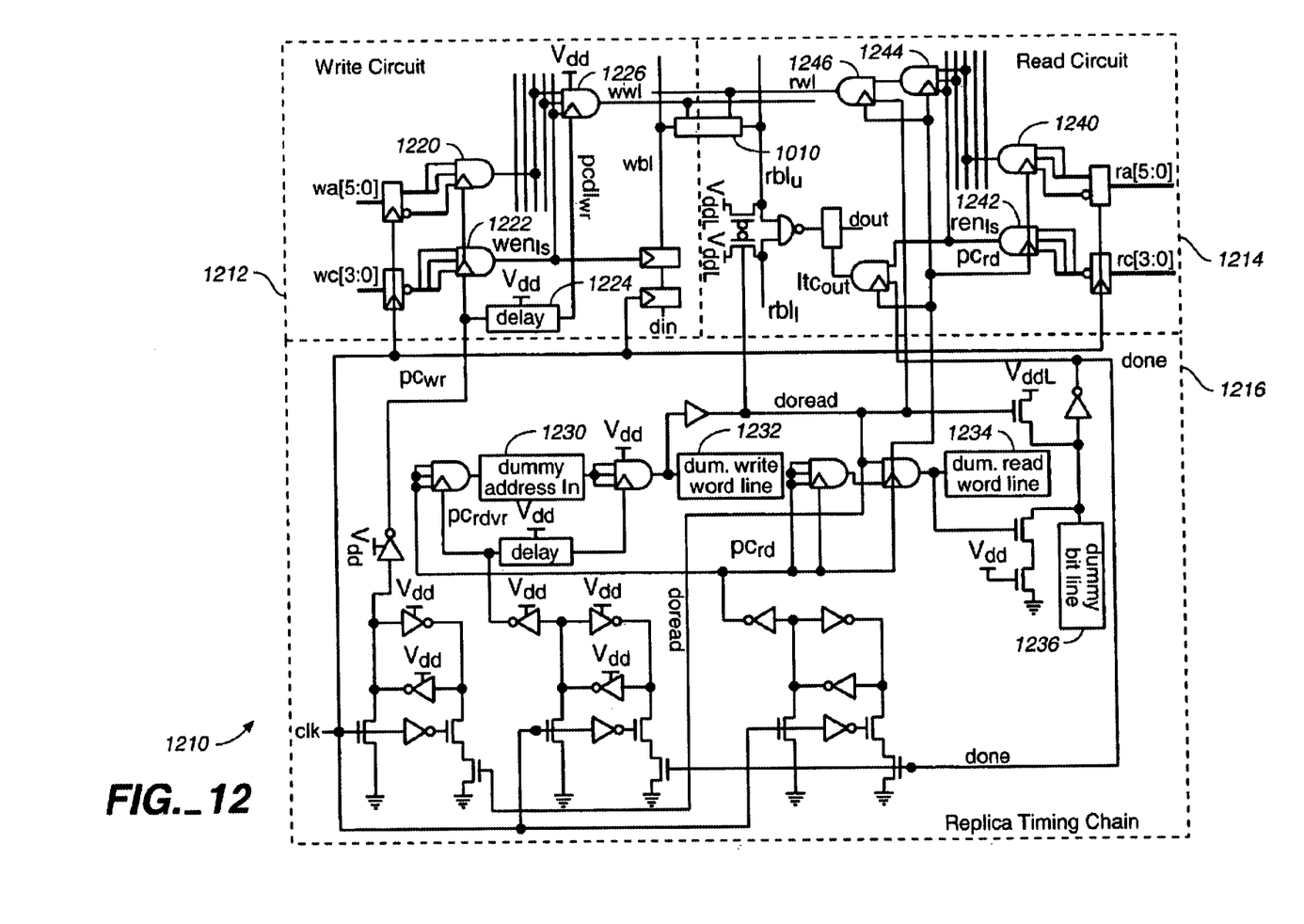
FIG. 12 is a RF control and data schematic of another aspect of the present invention.

First an overview of FIG. 12 is given, followed by descriptions of two parts of FIG. 12, a memory cell (FIG. 10) and a two-stage domino circuit (FIG. 11). Then a more detailed description of FIG. 12 is provided.

FIG. 12 shows a register file (RF) circuit useful in both desktop and battery markets, which implements an embodiment of the present invention. The RF circuit generates its own internal timing, accurately tracks process and temperature, and uses power supply variation from 0.7V to 1.2V. The 6-write, 10-read, 34 word×64 bit RF is part of a Very Long Instruction Word (VLIW) processor. The RF generates all internal timing from a single clock edge for a write followed by a read operation within one clock cycle. The RF circuit of FIG. 12 replicates the entire write and read timing path by using dummy loads, e.g., dummy predecoded address 1230, dummy write word 1232, dummy read word 1234, and dummy read bit lines 1236, thus eliminating the need for tuning self-timed signals and improving circuit reliability. Supply voltage VddL can be statically or dynamically stepped down from 1.2V to 0.7V to reduce power dissipation. Additionally, a separate power supply, Vdd, is provided for the array to allow a low-leakage sleep mode in which the RF maintains its state with VddL shut off. During low voltage operation, Vdd is stepped down from 1.2V to 1.05V. Voltage conversion between VddL at 0.7V and Vdd at 1.05 is done implicitly in the dynamic gates with little or no static power loss.

To keep the RF small despite its large port count, single-rail bit lines are used for both write and read. FIG. 10 is a schematic of a representative memory cell 1010 having one write and one read port. Transistors $M_1$, $M_2$, $M_3$, $M_4$ and $M_5$ are nMOS transistors. The cell inverters, e.g., $I_1$, $I_2$, and $I_3$, are powered from Vdd. Write word lines, e.g., wwl, are also powered from Vdd to enhance writes at low voltage operation, since Vdd is higher than VddL. Read word lines, e.g., rwl, as well as read and write bit lines (e.g., rbl and wbl, respectively) are powered from VddL. During writes, wwl is enabled. If the write bit line, wbl, is "0" only node bit is actively driven from outside the cell. If wbl is "1", node bit_bar is pulled down by $M_2$ and $M_3$, while node bit is pulled up through $M_1$ to (VddL–$V_{thM1}$), where $V_{thM1}$ is the threshold voltage of transistor $M_1$. Since the RF supports a write-through capability, write operations are complete only when node bitBf_bar has settled.

Read uses a 17×2 dynamic OR-AND (i.e., 17 cells per ½ bit line connected to a static NAND) to conserve power, increase speed, and reduce bit-line leakage. However, use of a high-threshold voltage device is also required in the stack ($M_4$) to provide adequate noise margin. Of the other transistors in the cell, only $M_5$ is (a low-$V_{th}$ transistor). (High-$V_{th}$) transistors are required elsewhere to meet the static leakage specification in sleep-mode.

FIG. 11 is a schematic of a two-stage dynamic domino logic circuit of an aspect of the present invention. At low voltage operation VddL is 0.7V and Vdd is 1.05V. Write word lines are powered from Vdd. RF addresses are decoded in two stages. For writes, the predecode stage, i.e., first stage 1110, is powered from VddL and node X3 is precharged when $pc_{wr}$ is '0.' For example, the first stage is a low voltage AND gate whose inputs (VddL In1) and output (predAd) have low voltage logic levels. The decode/drive stage, i.e., second stage 1112, is powered from Vdd and node X5 is precharged when $pcdl_{wr}$, a delayed $pc_{wr}$, is '0.' The delay 1122 means that the first stage 1110 precharges, before the second stage 1112 precharges, hence preAd is '0' before the second stage precharges. Assuming the inputs VddL In2 to pull-down circuit 1142 are also '0', the footer nMOS transistor T23 is not needed in the second stage 1112. The second stage 1112 is similar to circuit 700 in FIG. 7. Both $pc_{wr}$ and $pcdl_{wr}$ are powered from Vdd to avoid static current in the delay logic and the second precharged gate T24. The driver part of the second stage 1112 comes from the two optional inverters, Inv11 and Inv12. Voltage conversion from VddL at predAd to Vdd at wwl occurs implicitly as the signal passes through the second stage 1112. Thus the second stage includes a low-to-high voltage converter with, for example, an AND Boolean logic function.

FIG. 12 is a RF control and data schematic of another aspect of the present invention. Each write and read port has a 4-bit control input (wc[3:0] and rc[3:0], respectively) that enables the port and determines the access width (i.e., LS bits or MS bits, or both) and a 6-bit address (wa[5:0] and ra[5:0], respectively). Write ports receive 32 or 64 bit input data and read ports produce 32 or 64 bit output data. For simplicity of illustration, only one bit is shown in FIG. 12 for input data din and output data dout. The address wa[5:0] and control wc[3:0] bits are predecoded by the predecode stage, i.e., first stage 1110 (FIG. 11), e.g., AND gates 1220 and 1222, respectively, and then input into the decode/drive stage, i.e., second stage 1112 (FIG. 11), e.g., AND gate 1226. An example of the delay 1122 in FIG. 11 is shown by delay 1224 in FIG. 12. Reads use three stages of low voltage domino AND circuits, e.g., AND gates 1240 and 1242, as stage one, AND gate 1244 as stage 2, and AND gate 1246 as stage three. The third stage AND gate 1246 is enabled by doread, after the write operations have been completed.

Each word part per port is enabled with different control signals (wen$_{ls}$ and wen$_{ms}$ for write ports and ren$_{ls}$ and ren$_{ms}$ for read ports). For write ports, input data drives write bit lines (wbl in FIG. 10) only when the port is active. For read ports, the output latches are enabled only when the port is active. The RF operation is controlled by a replica timing chain 1216 that imitates the sequence of the micro-operations (e.g., write address decoding, data writing, and data reading). The self-timed chain contains dummy predecoded address 1230, dummy write word lines 1232, dummy read word lines 1234, and dummy read bit lines 1236. These are placed alongside the real ones.

Figure 13:
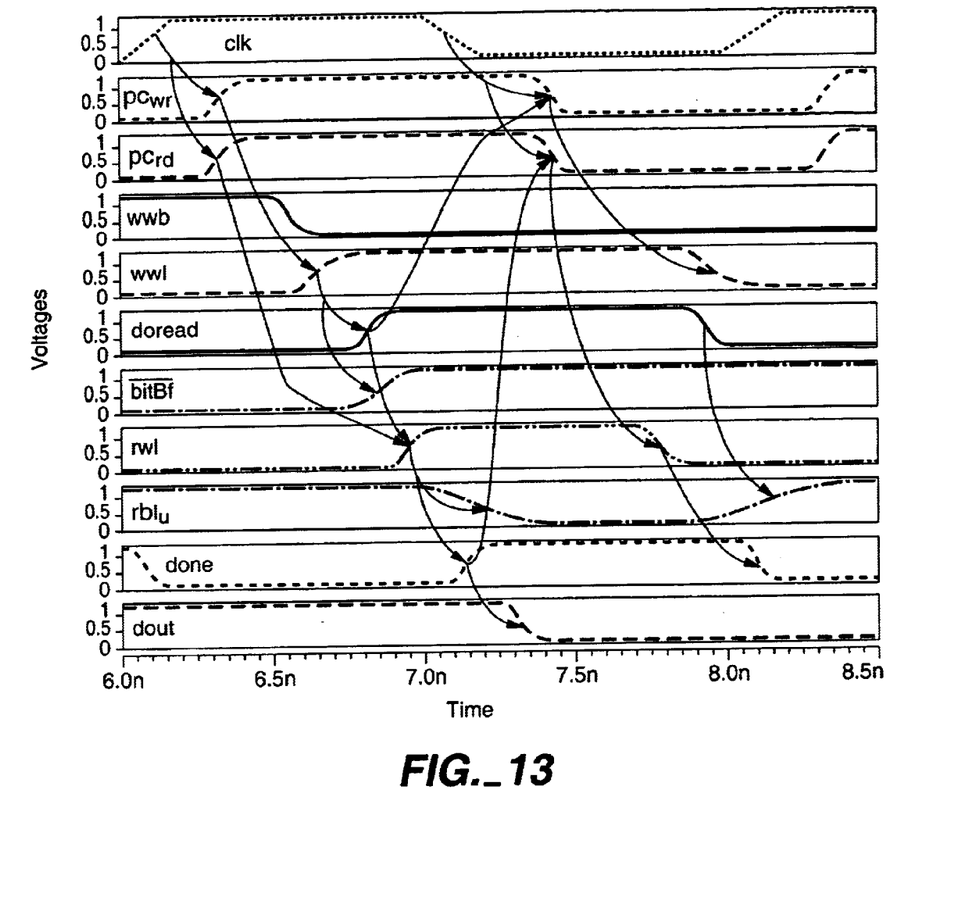
FIG. 13 is a timing diagram from a simulation showing the sequence and dependency of control and data signals for the schematic of FIG. 12.

FIG. 13 is a timing diagram from an HSPICE simulation showing the sequence and dependency of control and data signals for the schematic of FIG. 12. Some signals (i.e., pc$_{rdvr}$, wen$_{ls}$, ren$_{ls}$, and ltc$_{out}$) are omitted for simplicity. Every cycle, the control operation is fired on the positive clock edge, which sets the three set/reset latches on the bottom of FIG. 12. These latches generate three precharge signals: pc$_{wr}$ for the write decoder at Vdd, pcrd for the read decoder at VddL, and pc$_{rdvr}$ that is a Vdd signal identical to p$_{rd}$ and that is used in the self-timed chain. The two latches that generate pc$_{wr}$ and pcrd$_{vr}$ also serve as voltage converters since their inputs are VddL signals. Gates powered from Vdd are explicitly identified in FIG. 12; the others are powered from VddL. Setting the precharge signals high initiates the self-timed operation. The dummy decoder generates the doread signal which enables read word lines. Doread is also used to precharge the read bit lines, which are actively pulled-up while the write bit lines switch. The last part of the self-timed logic generates done, which indicates the end of the read operation and enables the ltc$_{out}$ signal for read ports. Doread in conjunction with the negative edge of the clock reset the latch that generates pc$_{wr}$. Likewise, done resets the latches that generates pc$_{rd}$ and pc$_{rdvr}$.

The specification and drawings are provided for illustrative purposes. It will be evident that additions, subtractions, deletions, and other modifications and changes may be made thereunto without departing from the broader spirit and scope of the invention as set forth in the claims.

What is claimed is:

1. A method for converting an input signal, comprising an input voltage from a low voltage source, to an output signal, comprising an output voltage from a high voltage source, by a digital circuit, comprising a pull-down logic network coupled to a node, the high voltage source having a voltage level greater than the low voltage source, said method comprising:

precharging said node to a high voltage using said high voltage source during a first period of time, said step including turning on a first transistor that is coupled between said high voltage source and said node;

turning off the first transistor during a subsequent second period of time;

receiving said input voltage from said low voltage source by said pull-down logic network;

determining a voltage of said node based on evaluating said pull-down logic network during the subsequent second period of time, the conductance between said node and said high voltage source being at the low level during the determination step; and using said voltage of said node, determining said output voltage.

2. The method of claim 1 further comprising maintaining said high voltage on said node by a keeper circuit.

3. The method of claim 2 wherein said keeper circuit comprises a pMOS transistor.

4. The method of claim 1 further comprising disconnecting said pull-down logic network from ground during said precharging.

5. The method of claim 1 further comprising setting said input voltage to a low logic level voltage during said precharging.

6. The method of claim 1 further comprising setting said input voltage to near ground during said precharging.

7. The method of claim 1 wherein said determining said output voltage comprises a CMOS gate inputting said voltage of said node and generating said output voltage.

8. The method of claim 1 wherein during said evaluating said pull-down logic network, said input voltage is stable.

9. The method of claim 1 wherein the digital circuit further comprises a ground potential, and wherein said method further comprises the step of substantially isolating the node from the ground potential during the first period of time.

10. A low-to-high voltage conversion system, comprising:

a pull-up transistor coupled to a high voltage source for charging a node during a first period of time when a precharge signal is received, said pull-up transistor being turned-on during the first period of time and being turned-off during a subsequent second period of time;

a low voltage source used for setting an input voltage, wherein said low voltage source produces a voltage reference less than said high voltage source;

a pull-down network for discharging said node during the subsequent second period of time depending, at least in part, on said input voltage, said pull-up transistor being turned-off when said node is being discharged by the pull-down network; and an output voltage determined from said node.

11. The low-to-high voltage conversion system of claim 10 wherein said output voltage comprises a high voltage from said high voltage source when said node is discharged.

12. The low-to-high voltage conversion system of claim 10 further comprising a keeper circuit for maintaining said node when charged, said keeper circuit comprising a pull up transistor.

13. The low-to-high voltage conversion system of claim 10 further comprising a foot switch for disconnecting said pull-down network when said precharged signal is received.

14. The low-to-high voltage conversion system of claim 13 wherein said foot switch comprises an nMOS transistor.

15. The low-to-high voltage conversion system of claim 10 wherein said output voltage is determined from said node using a CMOS gate.

16. The low-to-high voltage conversion system of claim 10 further comprising another input voltage set by using said low voltage source.

17. The low-to-high voltage conversion system of claim 16 wherein said pull down network is coupled to ground.

18. The low-to-high voltage conversion system of claim 17 wherein both said input voltage and said another input voltage are near ground when said precharge signal is received.

19. The low-to-high voltage conversion system of claim 10 wherein said voltage reference has a larger voltage range than a conventional low-to-high voltage converter circuit.

20. The low-to-high voltage conversion system of claim 10 wherein said input voltage comprises a voltage level above an effective threshold voltage of a transistor.

21. The low-to-high conversion system of claim 10 further comprising a ground potential, and wherein the node is substantially isolated from the ground potential during the first period of time.

22. A system for converting a first logic level at a low voltage to a second logic level at a high voltage, comprising:

a first terminal for receiving a high voltage source, said high voltage source having a value;

a second terminal for receiving a low voltage source which has a value less than the value of the high voltage source;

a pull-up transistor coupled to the high voltage source for charging a node during a first period of time when a precharge signal is at a low logic level, said pull-up transistor being turned-on during the first period of time and being turned-off during a subsequent second period of time when the precharge signal is at a high logic level;

an input signal, comprising an input voltage representing said first logic level, said input voltage set by using the low voltage source;

a pull-down network for discharging said node during the subsequent second period of time depending, at least in part, on said input voltage, said pull-up transistor being turned-off when said node is being discharged by the pull-down network;

a footer switch, comprising an nMOS transistor, and connecting said pull-down network to ground when said precharge signal is at the high logic level; and a keeper circuit, comprising a pMOS transistor, for maintaining said node when charged; and an output voltage determined from said node.

23. The system of claim 22 further comprising an additional input voltage set by using said low voltage source, wherein said pull-down network is further for discharging said node depending, at least in part, on said additional input voltage.

24. The system of claim 22 wherein the node is substantially isolated from the ground potential during the first period of time.

25. A low-to-high conversion system, comprising:

a first terminal for receiving a high voltage source, said high voltage source having a value;

a second terminal for receiving a low voltage source which has a value less than the value of the high voltage source;

circuitry generating an input signal from the low voltage source received at the second terminal;

means for precharging a node to a high voltage using the high voltage source received at the first terminal during a first period of time, said means for precharging the node including a first transistor that is turned on during the first period of time and turned off during a subsequent second period of time;

means for evaluating a voltage of said node based on said input voltage and a pull-down network during the subsequent second period of time, wherein said pull-down network has means for connecting said pull-down network to ground to discharge said node, the conductance between said node and said high voltage source being at the low level when the node is being discharged by the pull-down network; and means for using said voltage of said node to determine said output voltage.

26. The system of claim 25 further comprising means for keeping said high voltage on said node.

27. The system of claim 25 wherein said system is used in a register file.

28. The system of claim 25 further comprising a third terminal for receiving a ground potential and means for substantially isolating the node from the ground potential during the first period of time.

* * * * *